(12) United States Patent
Ciulik et al.

(10) Patent No.: US 7,922,812 B2
(45) Date of Patent: Apr. 12, 2011

(54) METHOD FOR GROWING SINGLE CRYSTALS OF METALS

(75) Inventors: James R. Ciulik, Austin, TX (US); Eric M. Taleff, Austin, TX (US)

(73) Assignee: Intellectual Ventures Holding 40 LLC, Las Vegas, NV (US)

( * ) Notice: Subject to any disclaimer, the term of this patent is extended or adjusted under 35 U.S.C. 154(b) by 137 days.

(21) Appl. No.: 11/936,954

(22) Filed: Nov. 8, 2007

(65) Prior Publication Data

US 2009/0120351 A1    May 14, 2009

(51) Int. Cl.
    *C30B 1/06* (2006.01)
(52) U.S. Cl. .............. 117/7; 427/180; 501/89
(58) Field of Classification Search .......... 117/7
    See application file for complete search history.

(56) References Cited

U.S. PATENT DOCUMENTS

| | | | |
|---|---|---|---|
| 3,435,668 A * | 4/1969 | Sandwith | 73/800 |
| 3,507,616 A * | 4/1970 | Tobin et al. | 423/440 |
| 4,255,049 A * | 3/1981 | Sahm et al. | 356/32 |
| 4,487,651 A * | 12/1984 | Wang | 117/81 |
| 5,205,872 A * | 4/1993 | Mitsunori et al. | 148/111 |
| 5,221,558 A * | 6/1993 | Sonuparlak et al. | 427/376.1 |
| 5,340,655 A * | 8/1994 | Creber et al. | 428/446 |
| 5,356,720 A * | 10/1994 | Creber et al. | 428/545 |
| 5,480,676 A * | 1/1996 | Sonuparlak et al. | 427/180 |
| 5,654,246 A * | 8/1997 | Newkirk et al. | 501/80 |
| 6,110,274 A * | 8/2000 | Okuno | 117/81 |
| 6,875,661 B2 * | 4/2005 | Mitzi | 438/285 |
| 7,514,160 B2 * | 4/2009 | Nagahama et al. | 428/811.1 |
| 2004/0047758 A1 * | 3/2004 | Olson et al. | 420/107 |
| 2005/0121117 A1 * | 6/2005 | Hufnagel et al. | 148/538 |
| 2009/0011925 A1 * | 1/2009 | Felix et al. | 502/60 |
| 2009/0120351 A1 * | 5/2009 | Ciulik et al. | 117/7 |
| 2010/0012231 A1 * | 1/2010 | D'Souza et al. | 148/555 |
| 2010/0040866 A1 * | 2/2010 | Mitzi et al. | 428/323 |

FOREIGN PATENT DOCUMENTS

EP    1445340 A    8/2004

OTHER PUBLICATIONS

Patent Cooperation Treaty, International Search Report and Written Opinion of the International Searching Authority, Oct. 25, 2006, 4 pages.
Bukhanovskii "Correlation Between the Strength and Creep of Molybdenum and Tungsten Alloys" Russian Metallurgy/ Metallyl/ Izvestiya Akademii Nauk SSSR, Allerton Press, Inc., XX, No. 5, Jan. 1, 1999, pp. 91-98, XP008063641, ISSN: 0036-0295.

(Continued)

*Primary Examiner* — Robert M Kunemund
(74) *Attorney, Agent, or Firm* — Schwabe, Williamson & Wyatt, P.C.

(57) ABSTRACT

A method for growing large single crystals of metals is disclosed. A polycrystalline form of a metal specimen is initially heated in a non-oxidizing environment. A minimum plastic strain is then applied to the heated metal specimen to initiate the growth of a selected grain within the heated metal specimen. Additional plastic strain is subsequently applied to the heated metal specimen to propagate the growth of the selected grain to become a large single crystal.

16 Claims, 2 Drawing Sheets

OTHER PUBLICATIONS

Fujii T. et al. "Preparation of a Large-Scale Molybdenum Single-Crystal Sheet by Means of Secondary Recrystallization" Journal of the Less-Common Metals, Elsevier-Sequoia S.A. Lausanne, CH, vol. 96, Jan. 1, 1984, pp. 297-304, XP024081945, ISSN: 0022-5088.

Lewandowski J.J. et al. "Effects of Impurity Segregation and Test Environment on Sustained Load Cracking of 214-Cr-1Mo steel-II. Crack Propagation" ACTA Metallurgica, Pergamon Press, US, vol. 35, No. 8, Aug. 1, 1987, pp. 2081-2090, XP024024371 ISSN: 0001-6160.

Luo A. et al. "High-Temperature Tensile Properties of Molybdenum and a molybdenum and a Molybdenum-0.5% hafnium carbide alloy" Scripta Metallurgica et Materialia, Oxford, GB, vol. 29, No. 6, Sep. 15, 1993, pp. 729-732, XP024180863, ISSN: 0956-716X.

Stephenson et al. "Comparative Creep-Rupture Properties of Tungsten-25% Rhenium Consolidated by Arc-Melting and Powder-Metallurgy Techniques" Journal of the Less-Common Metals, Elsevier-Sequoia S.A. Lausanne, CH, vol. 24, No. 2, Jun. 1, 1971, pp. 173-182, XP024070858, ISSN: 0022-5088.

European Search Report, mailed Jun. 2, 2009 for application 06752075.9.

Office Action, issued in CN Patent Application No. 200680024342.0, mailed Sep. 20, 2010, 3 pages.

Examination Report, issued in EP Patent Application No. 06752075.9, mailed Sep. 17, 2010, 6 pages.

Notice of Intention to Grant, issued in KR Patent Application No. 2007-7029075, mailed Oct. 25, 2010, 2 pages.

* cited by examiner

METHOD FOR GROWING SINGLE CRYSTALS OF METALS

RELATED PATENT APPLICATION

The present application claims benefit of priority under 35 U.S.C. §§120, 365 to the previously filed PCT Application No. PCT/US2006/016771 entitled, "Method for growing single crystals of metals" with a Priority date of May 12, 2005 and an International filing date of May 3, 2006, which is incorporated by reference herein.

BACKGROUND OF THE INVENTION

1. Technical Field

The present invention relates to crystal growing in general, and in particular to a method and apparatus for growing single crystals of metals. Still more specifically, the present invention relates to a method and apparatus for growing large single-crystal metals via plastic straining.

2. Description of Related Art

Polycrystalline metals often have limited high-temperature creep resistance and low-temperature brittleness due to the presence of grain boundaries. In contrast, single-crystal metals often have better mechanical properties due to the absence of grain boundaries. Thus, for many applications, single-crystal metals are preferred over polycrystalline metals.

Current technologies for producing single-crystal metals are primarily based on one of following five basic processes:
  (a) thin-film single crystals slowly grown through various deposition processes (currently used by the semiconductor industry);
  (b) bulk single crystals slowly grown from a molten metal using a seed crystal (i.e., the Czochralski process, the Bridgman process, or a variation of the Czochralski and the Bridgman processes);
  (c) bulk single crystals slowly produced by zone melting (also known as the floating-zone method) that uses a moving heating zone to perform localized melting of polycrystalline metal followed by solidification;
  (d) bulk single crystals produced by zone annealing, in which a heating zone is passed along polycrystalline metal to locally produce recrystallization, grain growth, and boundary migration of a single grain; and
  (e) bulk single crystals of refractory metals produced by alloying with oxide-forming elements followed by deformation at low temperatures, and followed by annealing at temperatures over 1800° C.

All of the above-mentioned processes generally have a very slow production rate, and for those processes that can yield large single crystals, such as processes (b)-(e), very high temperatures are typically required during production. Consequently, it is desired to provide an improved method for producing large single-crystal metals with faster production rates and at lower temperatures than those in the above-mentioned processes.

SUMMARY OF THE INVENTION

In accordance with a preferred embodiment of the present invention, a polycrystalline form of a metal specimen is initially heated in a non-oxidizing environment. A minimum plastic strain is then applied to the heated metal specimen to initiate the growth of a selected grain within the heated metal specimen. Additional plastic strain is subsequently applied to the heated metal specimen to propagate the growth of the selected grain to become a large single-crystal metal.

All features and advantages of the present invention will become apparent 11 in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
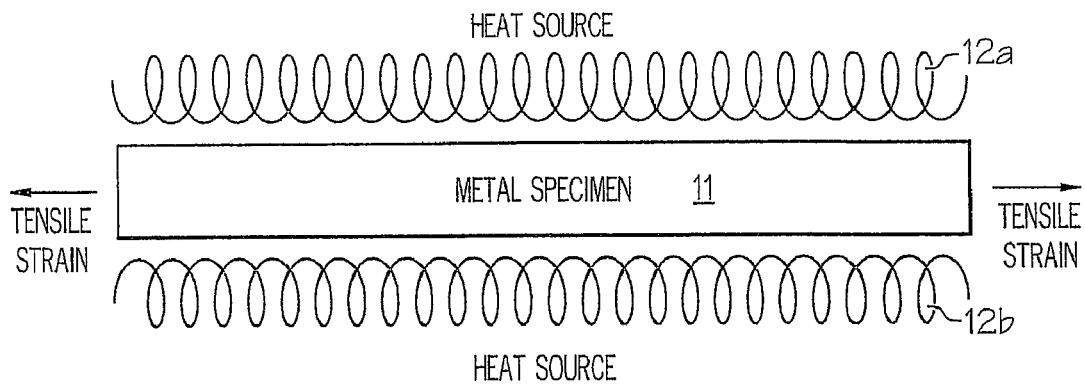
FIG. 1 is a diagram of an apparatus for growing large single-crystal metals, in accordance with a preferred embodiment of the present invention.

Referring now to the drawings and in particular to FIG. 1, there is depicted a diagram of an apparatus for growing large single-crystal metals, in accordance with a preferred embodiment of the present invention. As shown, a metal specimen 11 is located between heat sources 12a and 12b. In addition, the two distal ends of metal specimen 11 are secured to a mechanical device (not shown) that is capable of applying a plastic strain to metal specimen 11. Metal specimen 11 is preferably a polycrystalline specimen in either a recrystallized or a worked condition. Metal specimen 11 may be in a variety of forms, such as sheet, rod, plate, wire, tube, etc. Metal specimen 11 may be of high purity or commercial purity or may contain alloying additions.

Figure 2:
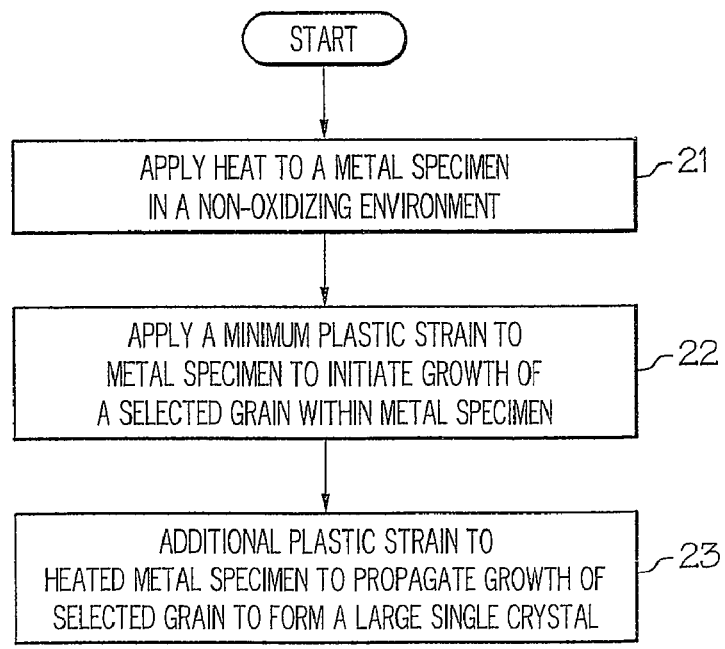
FIG. 2 is a high-level logic flow diagram of a method for growing large single-crystal metals using the apparatus from FIG. 1, in accordance with a preferred embodiment of the present invention.

With reference now to FIG. 2, there is illustrated a high-level logic flow diagram of a method for growing large single-crystal metals using the apparatus from FIG. 1, in accordance with a preferred embodiment of the present invention. Initially, metal specimen 11 is heated by heat sources 12a-12b to approximately 60% of metal specimen 11's melting temperature (i.e., an homologous temperature of 0.6) or higher, as shown in block 21. The heating of metal specimen 11 can be accomplished by a number of heating means. For example, metal specimen 11 can be heated by heat sources 12a-12b through radiative heat transfer, conductive heat transfer, or convective heat transfer. Metal specimen 11 can also be heated via radiant heating (for example, by infrared lamps), inductive heating, or direct resistance heating (by passing electric current through metal specimen 11). The heating of metal specimen 11 may be performed in a variety of non-oxidizing environments, such as vacuum, inert gas, or reducing atmosphere.

Then, a minimum initial plastic strain is applied by the mechanical device to heated metal specimen 11, as depicted in block 22. The minimum initial plastic strain is required to initiate growth of a selected grain within metal specimen 11. The amount of the minimum initial plastic strain is a function of temperature, microstructure, and alloy composition of metal specimen 11. The range of minimum initial plastic strains is preferably between approximately 4% and 40%.

Additional plastic strain is subsequently applied to heated metal specimen 11 to propagate the growth of the selected grain to form a large single crystal, as shown in block 23. The additional plastic strain is required to drive the growth front of the selected grain to consume the polycrystalline specimen being processed. The rate of additional plastic strain can cover a wide range, but is preferably greater than $10^{-5}$ s$^{-1}$ and less than $10^{-1}$ s$^{-1}$ in true-strain rate.

The mechanical device is capable of straining heated metal specimen 11 in a controlled manner. The required stress on metal specimen 11 to cause plastic straining depends on the desired plastic strain rate, temperature, microstructure, and alloy composition of metal specimen 11.

Plastic strain can also be generated by applying displacements to the two distal ends of metal specimen 11 such that metal specimen 11 is strained at a desired rate. By displacing one end of metal specimen 11 at a faster rate than the other, it is possible to continuously feed specimen material through a processing zone. By processing in such a manner, it is possible to pass the growth front along the length of metal specimen 11 to produce a long single crystal.

Figure 3:
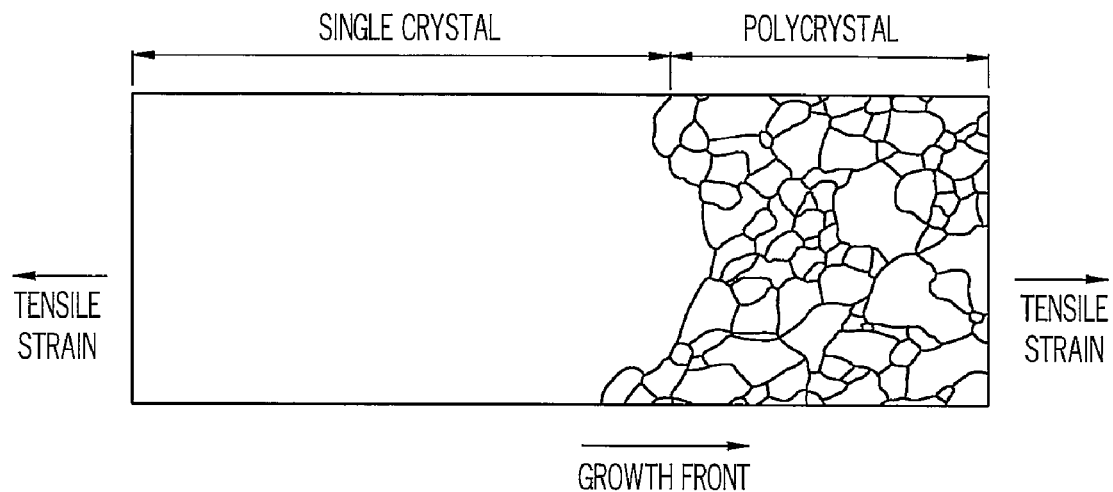
FIG. 3 is a diagram of a microstructural process for growing a single-crystal metal specimen, in accordance with a preferred embodiment of the present invention.

Referring now to FIG. 3, there is graphically illustrated a microstructural process for growing a single-crystal metal specimen, in accordance with a preferred embodiment of the present invention. A selected single grain (i.e., a crystal) consumes the width and thickness of a specimen under plastic straining at elevated temperature. The boundary of the single grain (i.e., the growth front) then progresses along the length of the metal specimen and consumes polycrystalline material. Motion of the growth front is driven by plastic straining at elevated temperature. The material left behind is a single crystal, which has been grown from the previously selected grain. As mentioned previously, the amount of the additional strain necessary to drive the growth front of the selected grain is a function of temperature, microstructure, and alloy composition of the metal specimen.

The selection of a grain to grow into the final single crystal can occur through a number of mechanisms. The simplest is a process of natural selection, by which a single grain favorably oriented within the polycrystalline specimen grows at a faster rate than surrounding grains. Such a process of natural selection can be influenced through the development of a crystallographic texture in the polycrystalline specimen. A seed crystal attached to a polycrystalline specimen, such as by welding the polycrystalline specimen to a seed crystal in a selected orientation, may act as the selected grain from which a single-crystal metal is grown. The crystallographic orientation of the final single-crystal metal is controlled by the selected grain from which it is grown.

The creation of a single-crystal metal is complete once the growth front of the selected grain has passed through the desired length of the metal specimen. Because the created single crystal may be plastically deformed during processing, the created single crystal may contain some dislocation density and some dislocation structures, such as subgrains. Such defects will not significantly affect the majority of desired properties of a single crystal. Most of the defects may be eliminated by annealing at an elevated temperature.

The method of the present invention has been successfully demonstrated with commercial-purity molybdenum in sheet form heated at elevated temperatures between 1400° C. and 1800° C. while mechanically strained at true-strain rates of $1.0\times10^{-6}$ to $1.0\times10^{-4}$ per second. In tests conducted at the above-stated temperature range and within the above-stated strain-rate range, growth of a single crystal from polycrystalline molybdenum sheet resulted after an accumulated strain of between 4% and 40%.

Figure 4:
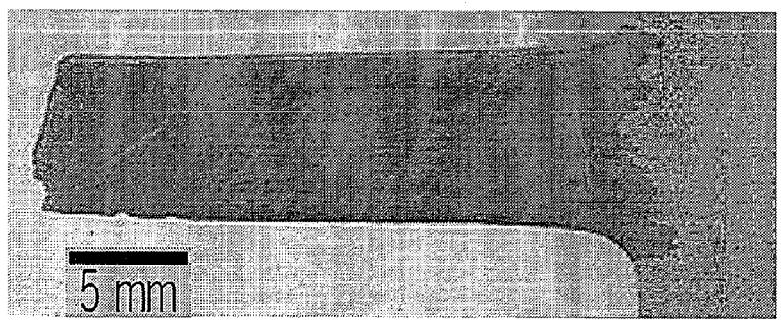
FIG. 4 is a photograph of the microstructure of a molybdenum sheet specimen produced in accordance with a preferred embodiment of the present invention.

With reference now to FIG. 4, there is depicted a photograph of the microstructure of a molybdenum sheet specimen processed at 1640° C. with a $1\times10^{-4}$ s$^{-1}$ plastic true-strain rate, in accordance with a preferred embodiment of the present invention. As shown, the molybdenum sheet specimen exhibited a large single crystal (approximately mm in width by 15 mm in length) grown from a polycrystalline sheet having grains with an average grain diameter of less than 70 μm. The single crystal (at the left) terminates in the wider polycrystalline region (at the right). Although only molybdenum in sheet form is utilized to illustrate the present invention, it is understood by those skilled in the art that the method of the present invention is also applicable to other metals in any other forms.

As has been described, the present invention provides a method and apparatus for growing large single-crystal metals. The method of the present invention allows large single-crystal metals to be produced using conventional equipment in a cost-effective manner. The method of the present invention has the advantages of simplicity and speed over current production technologies. The method of the present invention also enables a lower-temperature production of bulk single crystals than other existing processes.

While the invention has been particularly shown and described with reference to a preferred embodiment, it will be understood by those skilled in the art that various changes in form and detail may be made therein without departing from the spirit and scope of the invention.

What is claimed is:

1. A method for growing a single-crystal metal, the method comprising:
   heating a polycrystalline metal specimen in a non-oxidizing environment;
   applying a first plastic strain to the heated polycrystalline metal specimen to initiate growth of a grain of the heated polycrystalline metal specimen by displacing distal ends of the heated polycrystalline metal specimen; and
   applying a second plastic strain to the heated polycrystalline metal specimen to propagate growth of the grain to form a single-crystal metal by displacing a first distal end of the heated polycrystalline metal specimen at a faster rate than a second distal end of the heated polycrystalline metal specimen.

2. The method of claim 1, wherein the polycrystalline metal specimen comprises a refractory metal selected from the group consisting of molybdenum, tungsten, niobium, and tantalum.

3. The method of claim 1, wherein the polycrystalline metal specimen comprises a refractory metal with alloying additions.

4. The method of claim 1, wherein the non-oxidizing environment comprises vacuum, inert gas, or a reducing atmosphere.

5. The method of claim 1, wherein said heating is provided by an external heat source via radiation, conduction, or convection.

6. The method of claim 1, wherein said heating is provided via radiant heating by infra-red lamps, inductive heating, or direct resistance heating by passing an electric current through the metal specimen.

7. The method of claim 1, wherein said heating comprises heating the polycrystalline metal specimen between approximately 0.55 and 0.8 $T_m$, where $T_m$ is a melting temperature of the polycrystalline metal specimen.

8. The method of claim 1, wherein at least one of the first plastic strain and the second plastic strain is in tension, compression, shear, or a combination thereof.

9. The method of claim 1, wherein the grain is selected from the group consisting of a recrystallized microstructure, a textured microstructure, and a seed crystal.

10. The method of claim 1, further comprising passing the polycrystalline metal specimen through a heated zone or passing a heated zone along the polycrystalline metal specimen during said applying a first plastic strain and said applying a second plastic strain to produce the single crystal metal in a continuous manner.

11. The method of claim 1, wherein the polycrystalline metal specimen comprises molybdenum and wherein the first plastic strain is greater than 4% at a temperature between 1400° C. and 1800° C.

12. The method of claim 1, wherein said applying a first plastic strain comprises displacing the first distal end of the heated polycrystalline metal specimen at a faster rate than the second distal end of the heated polycrystalline metal specimen.

13. The method of claim 1, wherein the growth of the grain to form the single-crystal metal is propagated from the first distal end of the heated polycrystalline metal specimen to the second distal end of the heated polycrystalline metal specimen.

14. The method of claim 1, wherein the growth consumes the polycrystalline metal specimen to form the single-crystal metal.

15. The method of claim 1, wherein the first plastic strain is between 4% and 40%.

16. The method of claim 1, wherein a true-strain rate of the second plastic strain is between $10^{-5}$ $s^{-1}$ and $10^{-1}$ $s^{-1}$.

* * * * *

UNITED STATES PATENT AND TRADEMARK OFFICE
CERTIFICATE OF CORRECTION

PATENT NO. : 7,922,812 B2  Page 1 of 1
APPLICATION NO. : 11/936954
DATED : April 12, 2011
INVENTOR(S) : James R. Ciulik et al.

It is certified that error appears in the above-identified patent and that said Letters Patent is hereby corrected as shown below:

On the Title page, left-hand column, between Item 65 "Prior Publication Data" and Item 51 "Int. Cl.", the following item should be added:

Item --(60) Related U.S. Application Data
Continuation of application No. PCT/US06/16771, filed on May 3, 2006.
Provisional application No. 60/680,273, filed on May 12, 2005.--.

On the Title page, Item (56) under "Other Publications", "metallurgy/ Metallyl/ Izvestiya" should read --metallurgy/ Metally/ Izvestiya--.

Column 1, lines 9-10, "with a Priority date of May 12, 2005 and an International filing date of May 3, 2006" should read --with a Priority date of May 12, 2005 from U.S. Prov. App. No. 60/680,273 and an International filing date of May 3, 2006--.

Column 5, line 13, "1400° C. and 1800° C." should read --1400° C and 1800° C.--.

Signed and Sealed this
Twenty-third Day of August, 2011

David J. Kappos
*Director of the United States Patent and Trademark Office*